(12) United States Patent
Anzou et al.

(10) Patent No.: US 8,201,037 B2
(45) Date of Patent: Jun. 12, 2012

(54) SEMICONDUCTOR INTEGRATED CIRCUIT AND METHOD FOR CONTROLLING SEMICONDUCTOR INTEGRATED CIRCUIT

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 450 days.

(21) Appl. No.: 12/563,515

(22) Filed: Sep. 21, 2009

(65) Prior Publication Data

US 2010/0125766 A1 May 20, 2010

(30) Foreign Application Priority Data

Nov. 17, 2008 (JP) ................................ 2008-293457

(51) Int. Cl.
*G01R 31/28* (2006.01)
*G06F 11/00* (2006.01)

(52) U.S. Cl. .......... 714/733; 714/719; 714/736; 714/37; 714/48

(58) Field of Classification Search .................. 714/718, 714/719, 733, 734, 30, 37, 48, 736; 365/201
See application file for complete search history.

(56) References Cited

U.S. PATENT DOCUMENTS

| | | | | |
|---|---|---|---|---|
| 6,658,611 B1 * | 12/2003 | Jun | ............................... | 714/719 |
| 7,057,948 B2 * | 6/2006 | Shimizu et al. | ............... | 365/200 |
| 7,518,918 B2 * | 4/2009 | Gorman | ................... | 365/185.09 |
| 8,037,376 B2 * | 10/2011 | Anzou et al. | ................... | 714/711 |
| 2007/0011535 A1 | 1/2007 | Anzou et al. | | |
| 2008/0022176 A1 | 1/2008 | Anzou et al. | | |
| 2008/0165599 A1 * | 7/2008 | Gorman | ........................ | 365/200 |
| 2009/0024885 A1 | 1/2009 | Anzou et al. | | |
| 2009/0063917 A1 | 3/2009 | Tokunaga et al. | | |
| 2009/0172483 A1 | 7/2009 | Anzou et al. | | |

FOREIGN PATENT DOCUMENTS

| | | |
|---|---|---|
| JP | 08-255500 | 10/1996 |
| JP | 2002-319298 | 10/2002 |

* cited by examiner

*Primary Examiner* — Phung M Chung
(74) *Attorney, Agent, or Firm* — Turocy & Watson, LLP

(57) ABSTRACT

A semiconductor integrated circuit includes memories, a BIST circuit, and an analyzer. The BIST circuit includes a test controller performing the test and generating a memory selection signal selecting a memory to be tested, an address generator generating write and read addresses, a data generator generating write data and an expected output value, and a control signal generator generating a control signal. The analyzer includes a memory output selector selecting output data, a bit comparator comparing the output data with the expected output value, an error detection unit determining whether there is an error in the memory, a plurality of pass/fail flag registers capable of storing a pass/fail flag, a repair analyzer analyzing a memory error and generating a repair analysis result, a plurality of repair analysis result registers capable of storing the repair analysis result, and an output unit outputting the pass/fail flag and the repair analysis result.

15 Claims, 9 Drawing Sheets

SEMICONDUCTOR INTEGRATED CIRCUIT AND METHOD FOR CONTROLLING SEMICONDUCTOR INTEGRATED CIRCUIT

CROSS-REFERENCE TO RELATED APPLICATION

This application is based upon and claims the benefit of priority from the prior Japanese Patent Application No. 2008-293457, filed on Nov. 17, 2008; the entire contents of which are incorporated herein by reference.

BACKGROUND OF THE INVENTION

1. Field of the Invention

The present invention relates to a semiconductor integrated circuit and a method for controlling the semiconductor integrated circuit, and more particularly, to a semiconductor integrated circuit in which a memory self-test circuit and a redundancy repair analyzing circuit are built and to a method for controlling the semiconductor integrated circuit.

2. Related Art

A method is known by building a built-in self-test circuit (hereinafter, referred to as a 'BIST circuit') in a built-in memory of a semiconductor integrated circuit, in which an error is detected from the memory in a manufacturing test. Examples of the BIST circuit are a comparator-type BIST circuit that compares written data with read data to determine whether an error occurs and a compactor-type BIST circuit that compacts a read result and determines whether an error occurs based on the compacted result.

In addition, a redundancy repair technique in which an embedded memory that is determined as a defective memory is repaired using memory cells having a redundancy structure is known. The memory cells having the redundancy structure includes a row spare or a column spare. In the simplest structure, memory cells include a set of row spares or column spares for each repair unit. In more complicated structure, any of the following structures is a structure in which memory cells include both a row spare and a column spare, a structure in which memory cells include a plurality of row spares or column spares, and a structure in which one memory array is divided into a plurality of segments and memory cells having a repair structure is provided in each segment.

In order to use the redundancy repair technique for the manufacture of a semiconductor integrated circuit and a memory test, it is necessary to perform analysis using the result of the memory test, determine the error position of a memory and a spare used for repair (hereinafter, referred to as a 'repair analysis result'), and perform redundancy allocation based on the determined repair analysis result. In general, a direct access circuit that directly accesses a memory and a memory tester are used to perform the memory test, the fail bit map of the output of the memory is written into a storage unit of the memory tester, and a program in the memory tester starts to perform analysis.

However, in a conventional redundancy repair technique, a memory tester having a sufficient storage capacity to store the error information of all bits of a memory is required. Therefore, it is necessary to use both a memory tester and a logic tester to test a memory of a system LSI (Large Scale Integration) including a logic circuit and the memory.

Since a general large scale system LSI includes a large number of embedded memories, it is difficult to prepare the direct access circuit for each memory to be repaired.

As a technique for solving the above-mentioned problems, a built-in redundancy allocation (hereinafter, referred to as 'BIRA') circuit which performs analysis and redundancy allocation on a chip is known. The BIRA circuit is used together with the BIST circuit. The BIRA circuit analyzes the error information of a memory based on the error detection result of the BIST circuit to determine a repair analysis result, and outputs the determined repair analysis result as the analysis result. In a manufacturing process, a fuse device for storing the analysis result is programmed by using, for example, a laser blower, to repair a chip. In addition, when the repair analysis result is not determined, the BIRA circuit outputs information indicating that the repair analysis result has not been determined as the analysis result. In this case, the chip is treated as a defective chip. The BIRA circuit can be implemented by a relative small logic circuit, for the minimum redundancy structure having only one set of column spares.

The BIRA circuit determines whether an error occurs in a memory based on data read from the memory while testing, and analyzes the repair analysis result based on information, such as the bit position and address of the memory. In addition, the BIRA circuit updates the repair analysis result, considering the previous result, whenever data is sequentially read from the memory. Since the number of row spares or column spares is limited, it may be difficult to determine the repair analysis results for all errors according to the number of errors or the way of appearance thereof. Therefore, in this case, the BIRA circuit determines that the repair of the memory is unavailable, and outputs information indicating that the repair of the memory is unavailable.

In the both cases, error information for each address and each bit is required to analyze the repair analysis result. The BIST circuit using an output comparator compares the output of a memory with an expected output value by each bit and determines whether an error occurs based on the comparison result. The BIRA circuit can also use error information for each bit. Therefore, it is possible to prevent, to same extent, an increase in the number of circuits for each memory instance due to the addition of the function of the BIRA circuit.

However, even when error information for each bit is input, the BIRA circuit needs to determine whether repair is available based on the information, and generate a repair analysis result when it is determined that repair is available. This operation is generally performed by an encoder logic circuit. However, when the bit width of a memory is large, the size of a combination of the encoder logic circuit and the BIRA circuit is increased. In particular, the BIRA circuit is provided for each memory instance. Therefore, as the number of memory instances to be repaired is increased, the number of BIRA circuits in the entire semiconductor integrated circuit is increased. The BIRA circuits occupy a large portion of the logic circuit in the semiconductor integrated circuit.

In contrast, the following techniques are known. One technique in which one BIST circuit is provided for a plurality of memories, and the BIST circuit sequentially tests the memories, analyzes the repair analysis result thereof, and generates the analyzed repair analysis result (see Japanese Patent Laid-Open Publication No. 2002-319298) is known. Another technique in which the analysis of a repair analysis result and the output of the repair analysis result are sequentially performed (see Japanese Patent Laid-Open Publication 8-255500) is known.

However, in the above-mentioned techniques, the BIST circuit needs to stop whenever each memory is tested. Therefore, it is difficult to perform the next test until the analysis of a defective memory and the generation of a repair analysis result corresponding to the test are completely performed. As a result, the time required to test a memory is increased.

SUMMARY OF THE INVENTION

According to a first aspect of the present invention, there is provided a semiconductor integrated circuit comprising:
a plurality of memories configured to be able to store data;
a built-in self-test circuit configured to perform a test for the plurality of memories, the built-in self-test circuit comprising:
 a test controller configured to perform the test and generate a memory selection signal selecting a memory to be tested from the plurality of memories;
 an address generator configured to generate write and read addresses;
 a data generator configured to generate write data and an expected output value of the memory corresponding to the write data; and
 a control signal generator configured to generate a control signal performing a write operation for the write data to the write address of the memory and a read operation for read address of the memory; and
an analyzer configured to analyze a test result of the built-in self-test circuit, the analyzer comprising:
 a memory output selector configured to select output data of the plurality of memories based on the memory selection signal generated by the test controller;
 a bit comparator configured to compare the output data selected by the memory output selector with the expected output value generated by the data generator bit by bit;
 an error detection unit configured to determine whether there is an error in the memory based on a comparison result of the bit comparator;
 a plurality of pass/fail flag registers corresponding to the plurality of memories and configured to be able to store a pass/fail flag of the error detection unit;
 a repair analyzer configured to analyze a memory error based on the comparison result of the bit comparator and generate a repair analysis result;
 a plurality of repair analysis result registers corresponding to the plurality of memories and configured to be able to store the repair analysis result generated by the repair analyzer; and
 an output unit configured to output the pass/fail flag stored in the plurality of pass/fail flag registers and the repair analysis result stored in the plurality of repair analysis result registers.

According to a second aspect of the present invention, there is provided a semiconductor integrated circuit comprising:
a plurality of memories configured to be able to store data;
a built-in self-test circuit configured to perform a test for the plurality of memories, the built-in self-test circuit comprising:
 a test controller configured to perform the test in such a manner that one test is synchronized with the other test and generate a memory selection signal selecting a memory to be tested from the plurality of memories;
 an address generator configured to generate write and read addresses;
 a data generator configured to generate write data and an expected output value of the memory corresponding to the write data; and
 a control signal generator configured to generate a control signal performing a write operation for the write data to the write address of the memory and a read operation for read address of the memory; and
an analyzer configured to analyze a test result of the built-in self-test circuit, the analyzer comprising:
 a memory output selector configured to select output data of the plurality of memories based on the memory selection signal generated by the test controller;
 a bit comparator configured to compare the output data selected by the memory output selector with the expected output value generated by the data generator bit by bit;
 an error detection unit configured to determine whether there is an error in the memory based on a comparison result of the bit comparator;
 a pass/fail flag register configured to be able to store a pass/fail flag of the error detection unit;
 a repair analyzer configured to analyze a memory error based on the comparison result of the bit comparator and generate a repair analysis result;
 a repair analysis result register configured to be able to store the repair analysis result generated by the repair analyzer; and
 an output unit configured to output the pass/fail flag stored in the pass/fail flag register and the repair analysis result stored in the repair analysis result register.

According to a third aspect of the present invention, there is provided a method for controlling a semiconductor integrated circuit with a pass/fail flag register and a repair analysis result register, comprising:
performing a test for one memory instance of any of a plurality of memories;
determining whether there is an error in the memory based on a result of the test to write a pass/fail flag into the pass/fail flag register;
analyzing a memory error based on a result of the test to generate a repair analysis result and write the repair analysis result into the repair analysis result register; and
outputting the pass/fail flag stored in the pass/fail flag register and the repair analysis result stored in the repair analysis result register.

DETAILED DESCRIPTION OF THE INVENTION

Hereinafter, exemplary embodiments of the present invention will be described with reference to the accompanying drawings. The following embodiments of the present invention are just illustrative, but do not limit the scope of the invention.

[First Embodiment]

First, a first embodiment of the present invention will be described. The first embodiment of the present invention relates to an example of a semiconductor integrated circuit including memory collars, repair analysis result registers, and pass/fail flag registers. The number of repair analysis result registers and the number of pass/fail flag registers are the same as that of memory collars.

Figure 1:
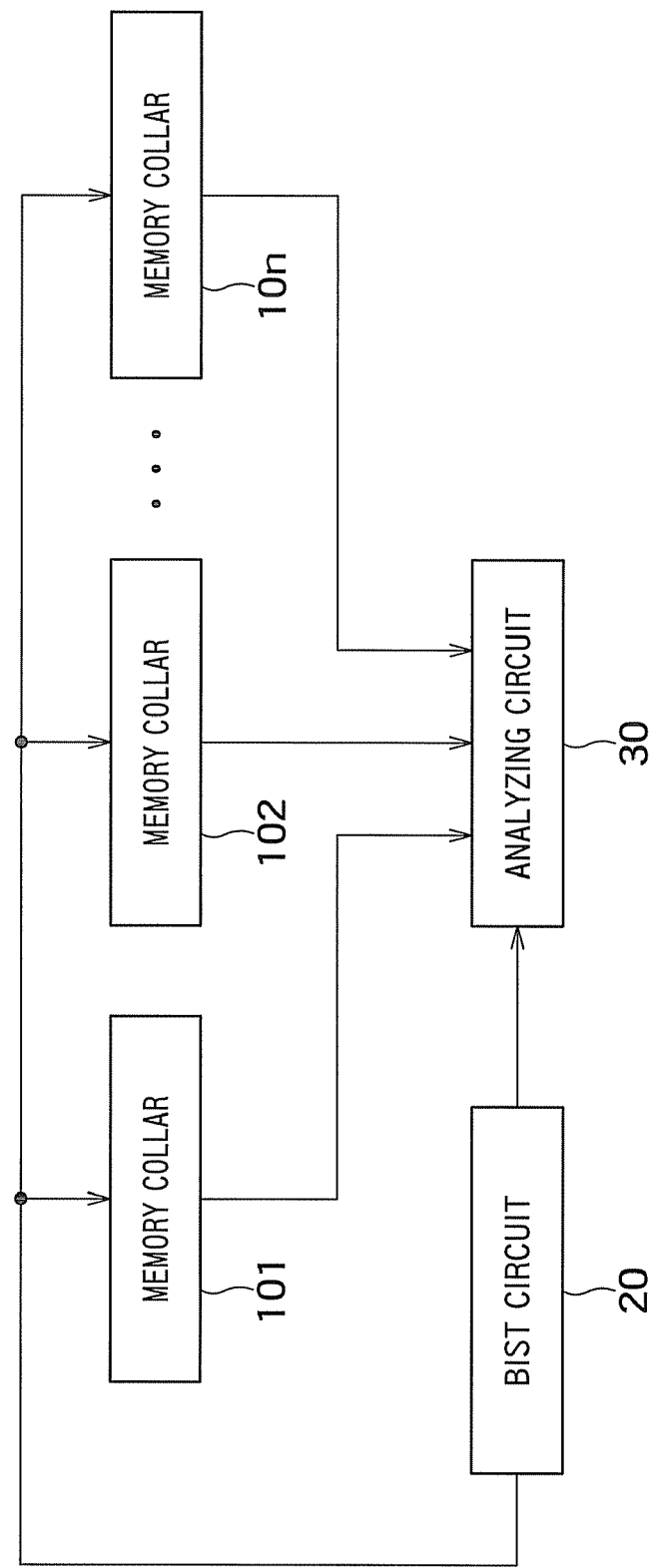
FIGS. 1 and 2 are block diagrams illustrating the structure of the semiconductor integrated circuit according to the first embodiment of the present invention.
Figure 2:
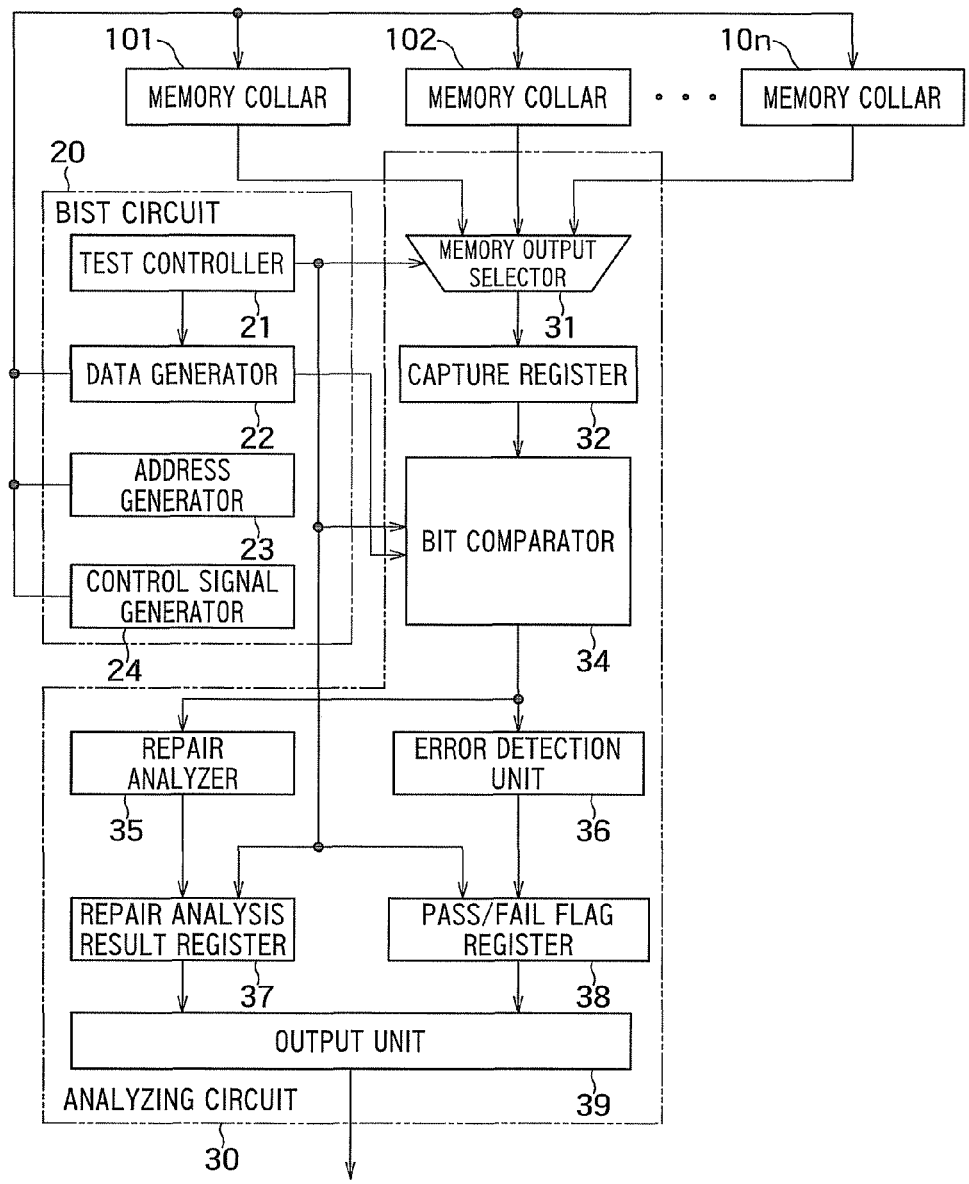
Figure 3:
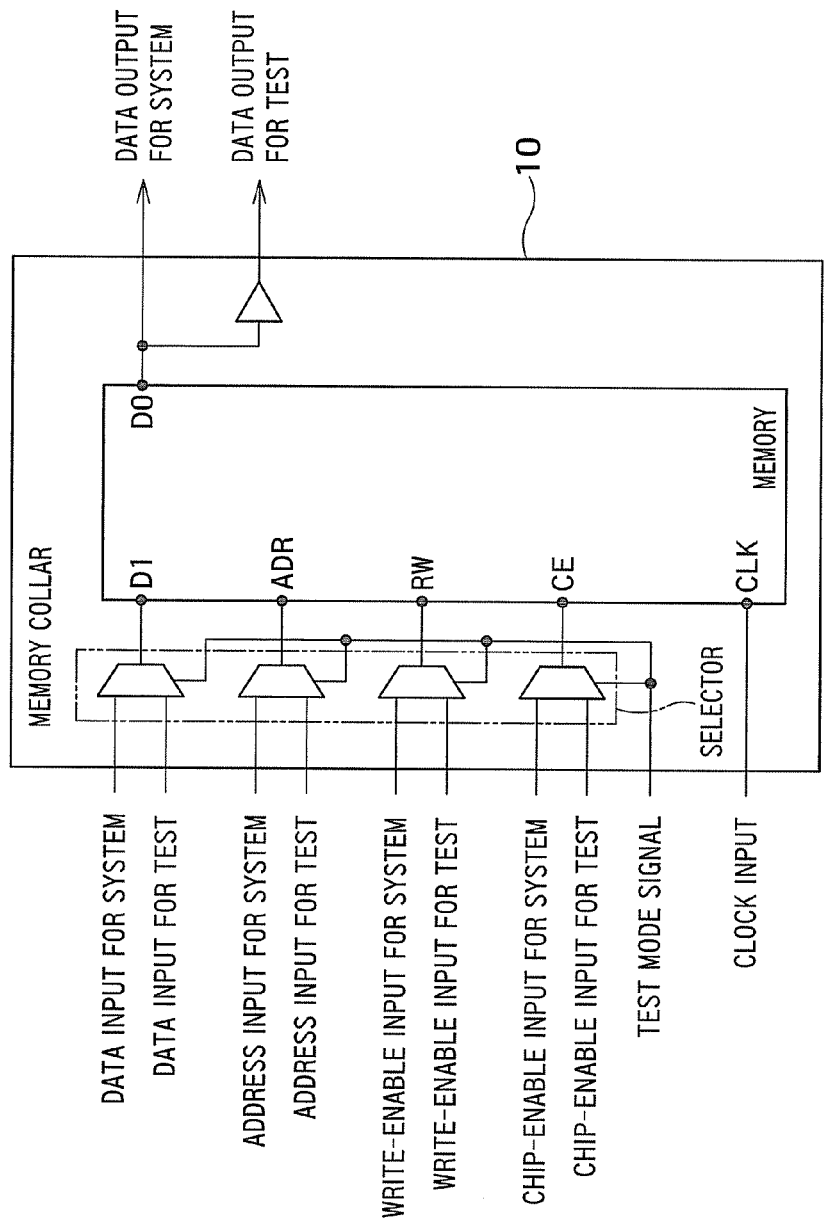
FIG. 3 is a block diagram illustrating the structure of memory collars 101 to 10$n$ shown in FIG. 2.
Figure 4:
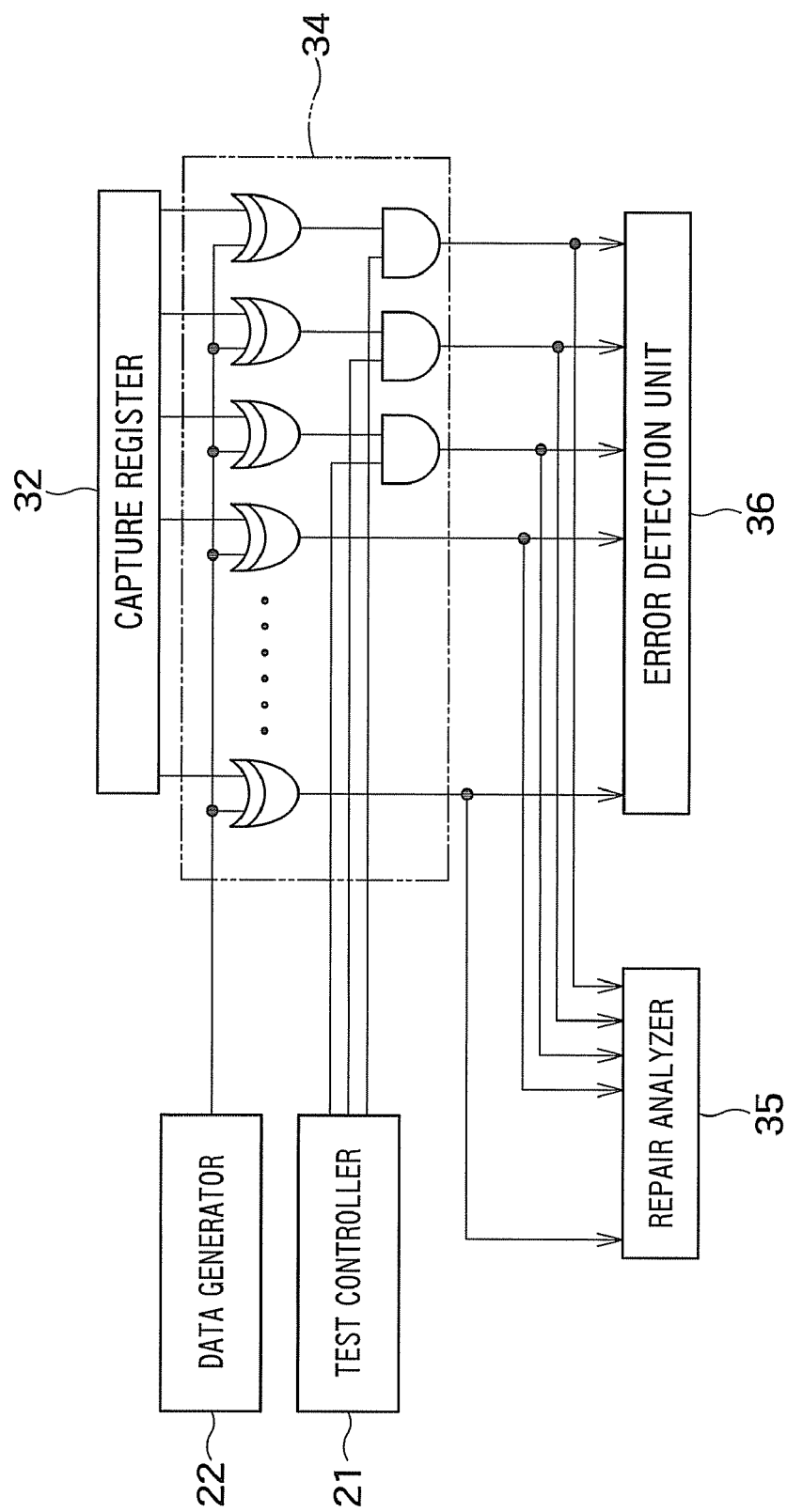
FIG. 4 is a block diagram illustrating the structure of a bit comparator 34 shown in FIG. 2.
Figure 5:
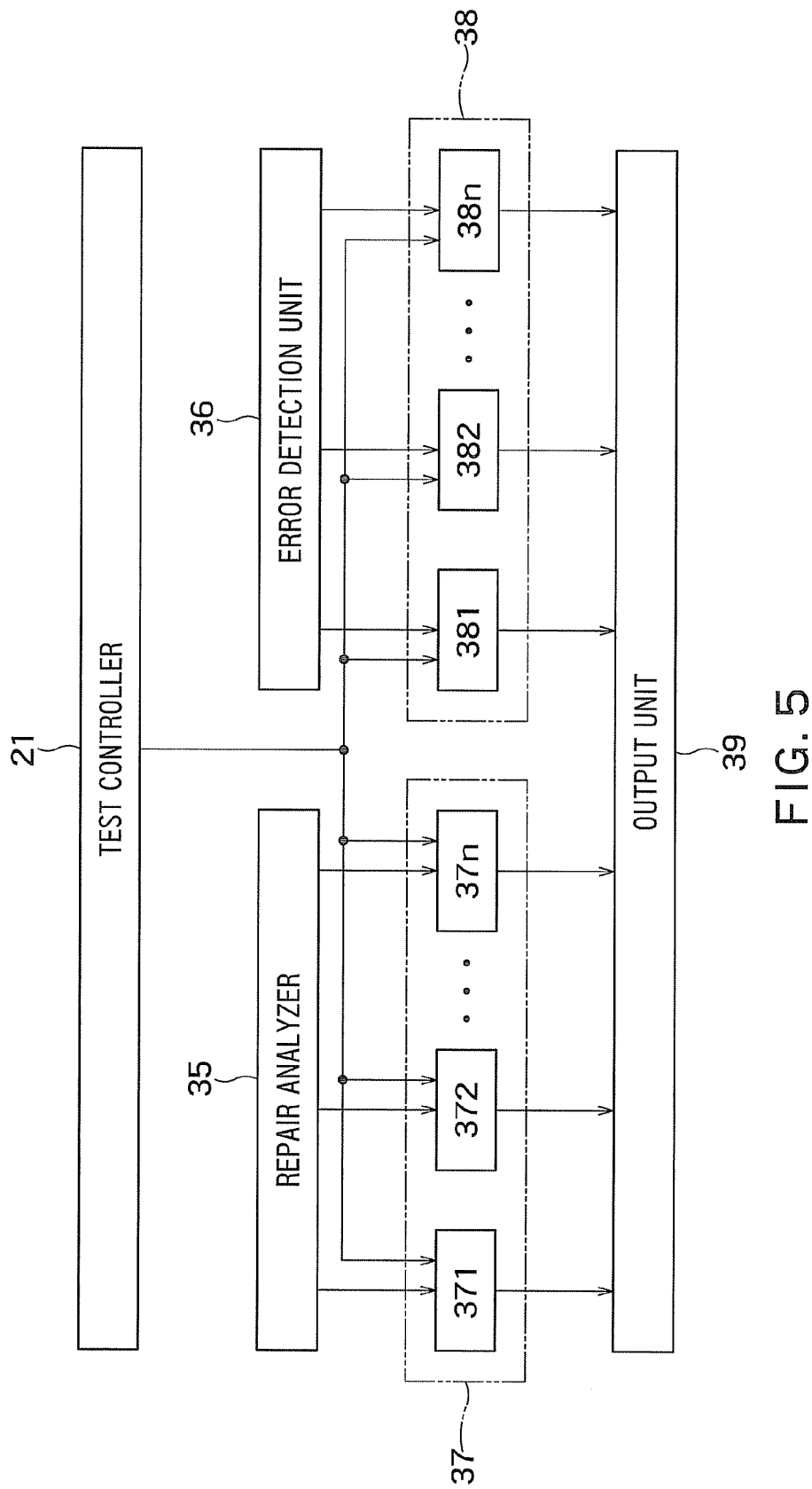
FIG. 5 is a block diagram illustrating the structures of a repair analysis result register 37 and a pass/fail flag register 38 shown in FIG. 2.

First, the structure of the semiconductor integrated circuit according to the first embodiment of the present invention will be described with reference to FIGS. 1 to 5. FIGS. 1 and 2 are block diagrams illustrating the structure of the semiconductor integrated circuit according to the first embodiment of the present invention. FIG. 3 is a block diagram illustrating the structure of memory collars 101 to 10$n$ shown in FIG. 2. FIG. 4 is a block diagram illustrating the structure of a bit comparator 34 shown in FIG. 2. FIG. 5 is a block diagram illustrating the structures of a repair analysis result register 37 and a pass/fail flag register 38 shown in FIG. 2.

As shown in FIG. 1, the semiconductor integrated circuit according to the first embodiment of the present invention includes n (n is a natural number) memory collars 101 to 10$n$, a BIST circuit 20, and an analyzing circuit 30. The n memory collars 101 to 10$n$ share the BIST circuit 20 and the analyzing circuit 30.

As shown in FIG. 2, the memory collars 101 to 10$n$ are connected to a data generator 22 (which will be described below), an address generator 23 (which will be described below), and a control signal generator 24 (which will be described below) of the BIST circuit 20, and a memory output selector 31 of the analyzing circuit 30. For example, as shown in FIG. 3, each of the memory collars 101 to 10$n$ includes a memory having a data input terminal DI, an address input terminal ADR, a write-enable input terminal RW, a chip-enable input terminal CE, a clock input terminal CLK, and a data output terminal DO, and a selector that selects an input for test or an input for system of each input terminal based on a test mode signal. The memory of each of the memory collars 101 to 10$n$ stores data with an arbitrary bit width.

As shown in FIG. 2, the BIST circuit 20 includes a test controller 21, the data generator 22, the address generator 23, and the control signal generator 24.

As shown in FIG. 2, the test controller 21 is connected to the data generator 22, and a memory output selector 31, a bit comparator 34, a repair analysis result register 37, and a pass/fail flag register 38 of the analyzing circuit 30. In addition, the test controller 21 performs data generation, address generation, and control signal generation in a predetermined sequence such that a necessary test is performed on the memories of the memory collars 101 to 10$n$, thereby performing a test. In addition, the test controller 21 generates a memory selection signal for selecting a memory to be tested from the n memory collars 101 to 10$n$ and outputs the generated memory selection signal to the memory output selector 31, the repair analysis result register 37, and the pass/fail flag register 38. For example, the test controller 21 recognizes a memory instance while testing, and generates a memory selection signal for selecting the output thereof.

As shown in FIG. 2, the data generator 22 is connected to the test controller 21, the n memory collars 101 to 10$n$, and the bit comparator 34 of the analyzing circuit 30. Further, the data generator 22 generates data for test to be written into the n memory collars 101 to 10$n$ (hereinafter, referred to as 'write data') and outputs the generated data to the n memory collars 101 to 10$n$. In addition, the data generator 22 generates the expected output values of the n memory collars 101 to 10$n$ corresponding to the write data, and outputs the generated values to the bit comparator 34. In this case, the data generator 22 outputs the write data to each of the memory collars 101 to 10$n$ while sequentially selecting the write data such that one memory is tested by one test operation. In addition, the data generator 22 generates the expected output values according to the maximum bit widths of the memory collars 101 to 10$n$.

As shown in FIG. 2, the address generator 23 is connected to the n memory collars 101 to 10$n$. In addition, the address generator 23 generates the addresses of the n memory collars 101 to 10$n$ into which the write data generated by the data generator 22 will be written (hereinafter, referred to as 'write addresses') and the addresses for read operation (hereinafter, referred to as 'read addresses'), and outputs the generated write and read addresses to the n memory collars 101 to 10$n$.

As shown in FIG. 2, the control signal generator 24 is connected to the n memory collars 101 to 10$n$. In addition, the control signal generator 24 generates a control signal for performing a write operation and a read operation on the memory collars 101 to 10$n$, and outputs the control signal to the n memory collars 101 to 10$n$.

As shown in FIG. 2, the analyzing circuit 30 includes the memory output selector 31, a capture register 32, the bit comparator 34, a repair analyzer 35, an error detection unit 36, the repair analysis result register 37, the pass/fail flag register 38, and an output unit 39.

As shown in FIG. 2, the memory output selector 31 is connected to the n memory collars 101 to 10$n$, the test controller 21 of the BIST circuit 20, and the capture register 32. In addition, the memory output selector 31 selects the output data of the n memory collars 101 to 10$n$ based on the memory selection signal generated by the test controller 21, and outputs the selected output data to the capture register 32.

As shown in FIG. 2, the capture register 32 is connected to the memory output selector 31 and the bit comparator 34. In addition, the capture register 32 has the same bit width as the maximum bit width of the memories of the n memory collars 101 to 10$n$. The capture register 32 stores the output data selected by the memory output selector 31.

As shown in FIG. 2, the bit comparator 34 is connected to the test controller 21 and the data generator 22 of the BIST circuit 20, the capture register 32, the repair analyzer 35, and the error detection unit 36. In addition, the bit comparator 34 masks an unnecessary bit of the expected output value from the data generator 22, selects only a necessary bit, compares the output data with the necessary bit of the expected output value, and outputs the comparison result to the repair analyzer 35 and the error detection unit 36. For example, as shown in FIG. 4, the bit comparator 34 includes a plurality of XOR elements and a plurality of AND elements. Each of the XOR elements is connected to the data generator 22 and the capture register 32. Some of the XOR elements are also connected to the plurality of AND elements, the repair analyzer 35, or the error detection unit 36. The result of the XOR operation between the output (output data) of the capture register 32 and the output (expected output value) of the data generator 22 is output from the XOR element connected to the error detection unit 36 and the repair analyzer 35 to the bit comparator 34, and a fixed value "0" indicating an unnecessary bit is output from the AND element to the error detection unit 36 and the repair analyzer 35. The result (for example, when there is no memory error, the result of the XOR operation is "0", and when there is a memory error, the result of the XOR operation is "1") of the XOR operation between the output (output data) of the capture register 32 and the output (a necessary bit of the expected output value) of the data generator 22 is output from the bit comparator 34 to the repair analyzer 35 and the error detection unit 36. In the first embodiment of the present invention, only error bits of all data bits of the bit comparator 34 is "1".

As shown in FIG. 2, the repair analyzer 35 is connected to the bit comparator 34 and the repair analysis result register 37. In addition, the repair analyzer 35 analyzes a memory error based on the output of the bit comparator 34. When the memory can be repaired, the repair analyzer 35 generates a repair analysis result, and outputs the generated repair analysis result to the repair analysis result register 37.

As shown in FIG. 2, the error detection unit 36 is connected to the bit comparator 34 and the pass/fail flag register 38. In addition, the error detection unit 36 determines whether there is an error in the memory based on the output of the bit comparator 34. For example, the error detection unit 36 determines that an error occurs when the output of the bit comparator 34 includes at least one "1".

As shown in FIG. 2, the repair analysis result register 37 is connected to the test controller 21 of the BIST circuit 20, the repair analyzer 35, and the output unit 39. The pass/fail flag register 38 is connected to the test controller 21 of the BIST circuit 20, the error detection unit 36, and the output unit 39. The repair analysis result register 37 stores the repair analysis result output from the repair analyzer 35, and the pass/fail flag register 38 stores the error pass/fail flag of the error detection unit 36. For example, as shown in FIG. 5, the repair analysis result registers 371 to 37$n$ whose number is equal to the number of memory collars 101 to 10$n$ store the repair analysis results of the memory collars 101 to 10$n$, respectively. The pass/fail flag registers 38$a$ to 38$n$ whose number is equal to the number of memory collars 101 to 10$n$ store the error pass/fail flags of the memory collars 101 to 10$n$, respectively. In each of the repair analysis result registers 371 to 37$n$ and each of the pass/fail flag registers 38$a$ to 38$n$, information stored in only the repair analysis result registers 371 to 37$n$ and the pass/fail flag registers 38$a$ to 38$n$ corresponding to the memory instance while testing is updated based on the memory selection signal output from the test controller 21.

As shown in FIG. 2, the output unit 39 is connected to the repair analysis result register 37, the pass/fail flag register 38, and an external device (not shown). When a test for all memory instances is completed, the output unit 39 outputs the repair analysis result stored in the repair analysis result register 37 and the error pass/fail flag stored in the pass/fail flag register 38 as parallel signals or serial signals to an external device (not shown) such as a memory tester. The repair analysis result and the error pass/fail flag are used by the external device (not shown) in the post process.

Figure 6:
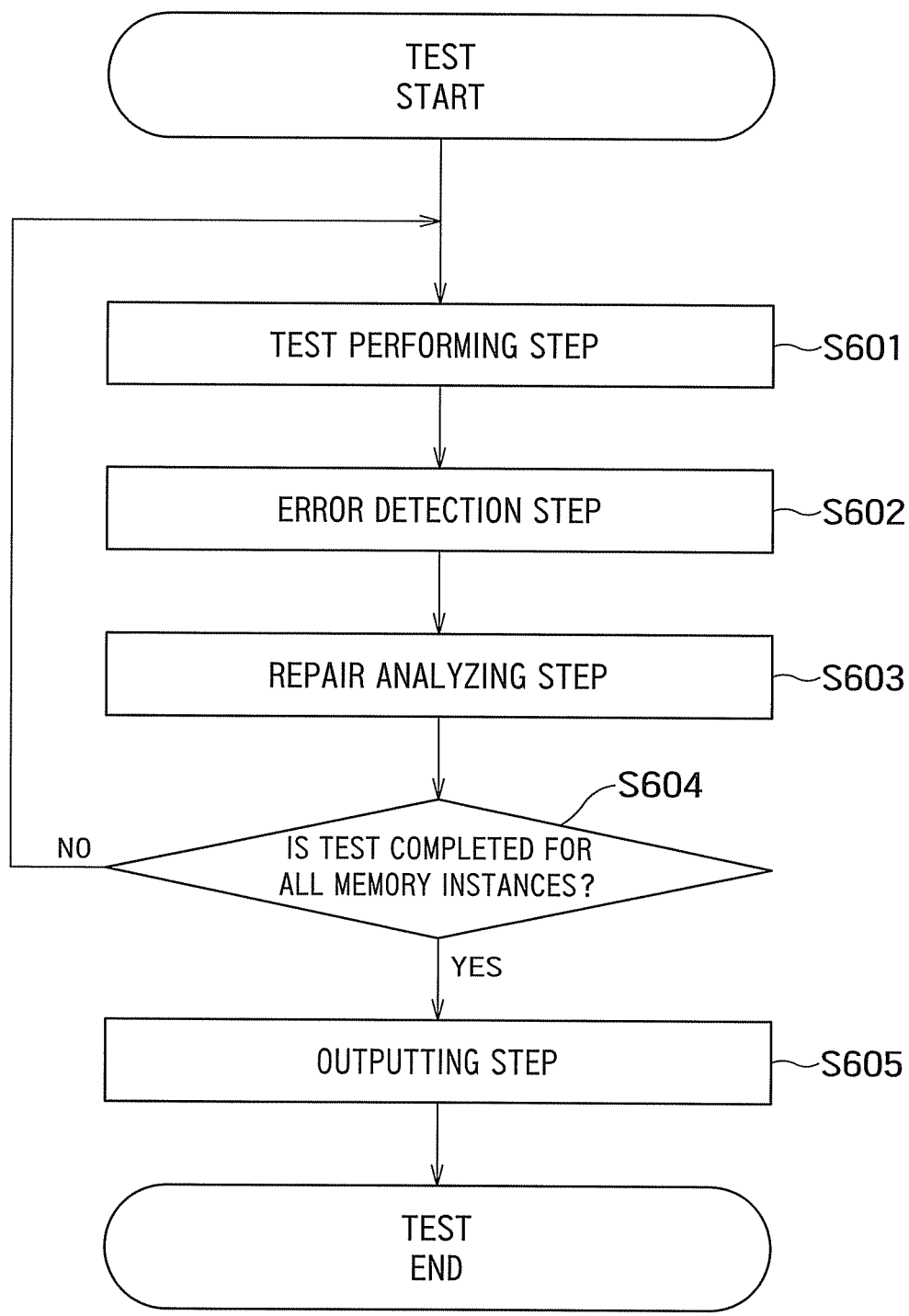
FIG. 6 is a flowchart illustrating a test process of the semiconductor integrated circuit according to the first embodiment of the present invention.

Next, a process of the semiconductor integrated circuit according to the first embodiment of the present invention will be described with reference to FIG. 6. FIG. 6 is a flowchart illustrating a test process of the semiconductor integrated circuit according to the first embodiment of the present invention.

First, as shown in FIG. 6, the BIST circuit 20 performs a test performing step (S601). In the test performing step (S601), the test controller 21 of the BIST circuit 20 tests one memory instance for any of the n memory collars 101 to 10$n$. In this case, the bit comparator 34 compares the output data of the n memory collars 101 to 10$n$ with the expected output values.

Then, as shown in FIG. 6, an error detection step (S602) is performed. In the error detection step (S602), the error detection unit 36 determines whether there is an error in the memory based on the test result obtained in the test performing step (S601), and writes the error pass/fail flag into the pass/fail flag register 38.

Then, as shown in FIG. 6, a repair analyzing step (S603) is performed. In the repair analyzing step (S603), the repair analyzer 35 analyzes a memory error based on the test result obtained in the test performing step (S601). When the memory can be repaired, the repair analyzer 35 generates a repair analysis result, and writes the repair analysis result into the repair analysis result register 37.

As shown in FIG. 6, Steps S601 to S603 are repeatedly performed until all the memory instances are completely tested (S604-NO).

If all the memory instances are completely tested (S604-YES), as shown in FIG. 6, an outputting step (S605) is performed. In the outputting step (S605), the output unit 39 outputs the repair analysis results of all the memory instances stored in the repair analysis result register 37 and the error pass/fail flags of all the memory instances stored in the pass/fail flag register 38 to an external device (not shown).

As shown in FIG. 6, the test of the semiconductor integrated circuit according to the first embodiment of the present invention is completed after the outputting step (S605).

In the first embodiment of the present invention, the memory of each of the memory collars 101 to 10$n$ stores data with an arbitrary bit width. However, the memories of the memory collars 101 to 10$n$ may store data with the same bit width. In this case, the AND elements provided in the bit comparator 34 are omitted.

According to the first embodiment of the present invention, as shown in FIG. 6, the repair analysis result register 37 and the pass/fail flag register 38 store the repair analysis result and the error pass/fail flag in one-to-one correspondence with the memory collars 101 to 10$n$ (that is, for each memory instance). Therefore, until all the memory instances are completely tested, it is possible to continuously operate the BIST circuit 20.

According to the first embodiment of the present invention, as shown in FIG. 2, memory output selector 31 configured to select output data of n memory collars 101 to 10$n$ based on the memory selection signal generated by the test controller 21. Therefore, the memory collars 101 to 10$n$ can share the BIST circuit 20 and the analyzing circuit 30. As a result, it is possible to prevent an increase in the size of a semiconductor integrated circuit due to the addition of a test circuit.

[Second Embodiment]

Next, a second embodiment of the present invention will be described. The second embodiment of the present invention relates to an example of a semiconductor integrated circuit including a repair analysis result register and a pass/fail flag register each having a minimum number of registers. In the second embodiment of the present invention, a description of the same content as that in the first embodiment of the present invention will not be described.

Figure 7:
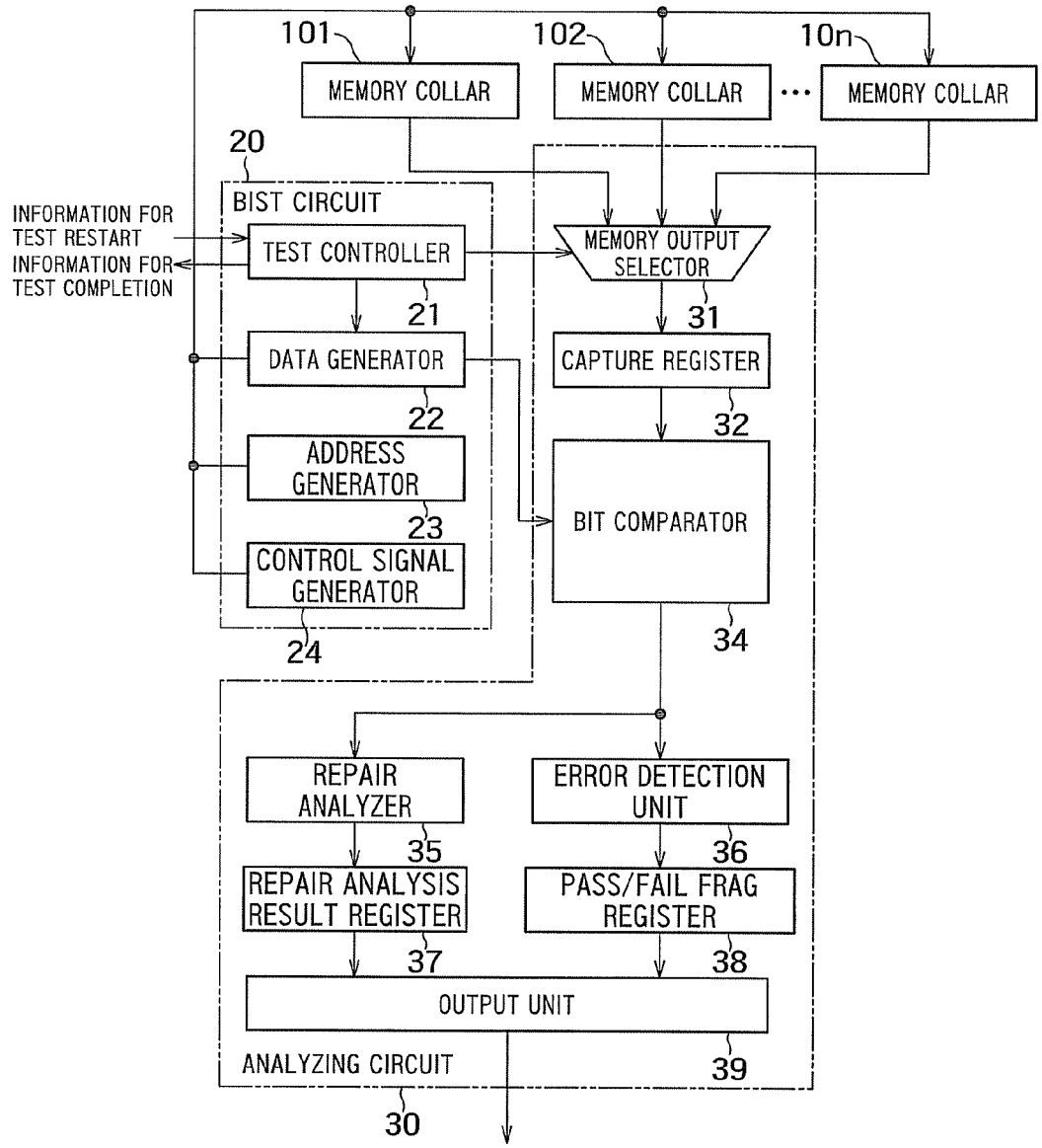
FIG. 7 is a block diagram illustrating the structure of the semiconductor integrated circuit according to the second embodiment of the present invention.
Figure 8:
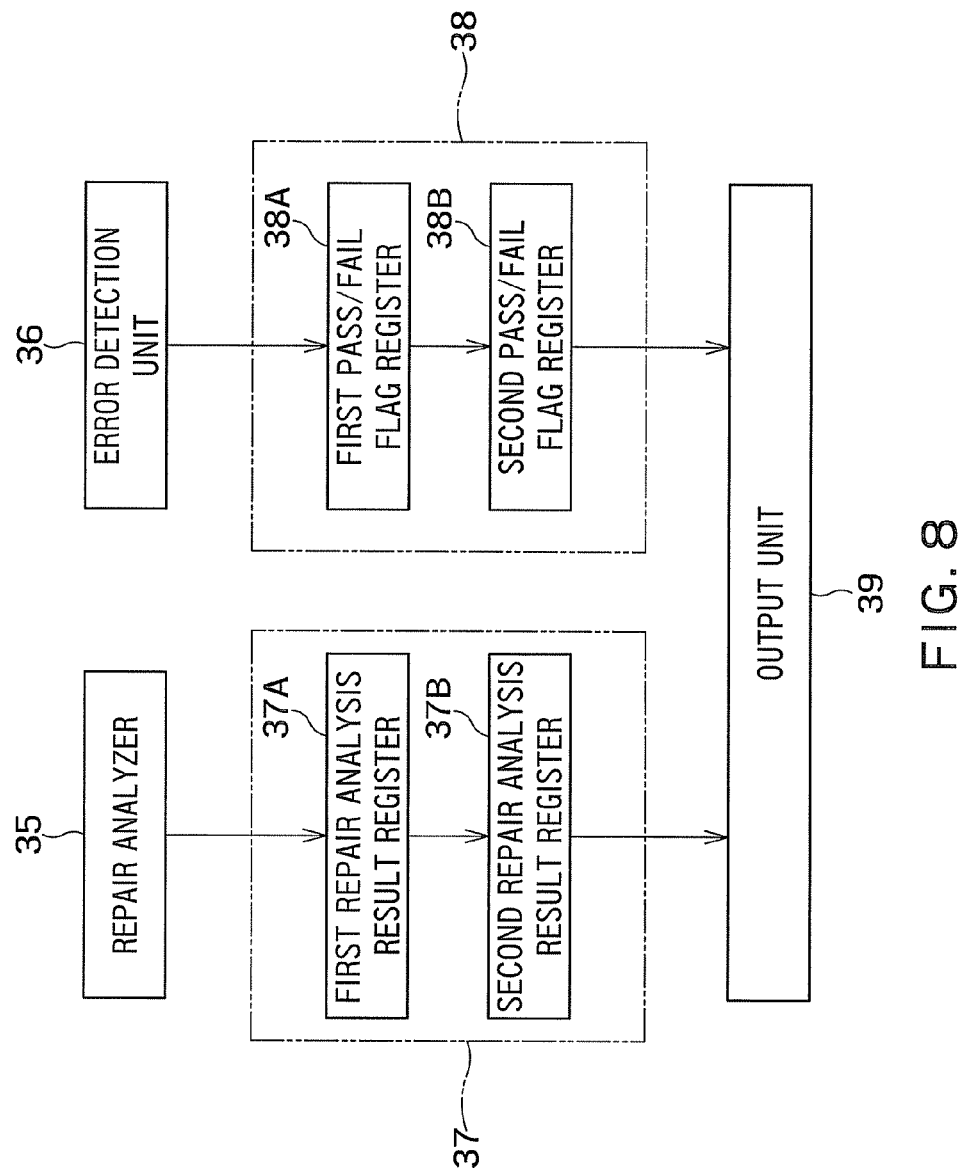
FIG. 8 is a block diagram illustrating the structure of a repair analysis result register 37 and a pass/fail flag register 38 shown in FIG. 7.

First, the structure of the semiconductor integrated circuit according to the second embodiment of the present invention will be described with reference to FIGS. 7 and 8. FIG. 7 is a block diagram illustrating the structure of the semiconductor integrated circuit according to the second embodiment of the present invention. FIG. 8 is a block diagram illustrating the structure of a repair analysis result register 37 and a pass/fail flag register 38 shown in FIG. 7.

As shown in FIG. 7, a BIST circuit 20 includes a test controller 21, a data generator 22, an address generator 23, and a control signal generator 24. The structures of the data generator 22, the address generator 23, and the control signal generator 24 are the same as those in the first embodiment of the present invention.

As shown in FIG. 7, the test controller 21 is connected to the data generator 22 and the memory output selector 31 of the analyzing circuit 30. The test controller 21 performs data generation, address generation, and control signal generation in a predetermined sequence such that a necessary test is performed on the memories of the memory collars 101 to 10n, thereby performing a test. In addition, the test controller 21 generates a memory selection signal for selecting a memory to be tested from the n memory collars 101 to 10n and outputs the generated memory selection signal to the memory output selector 31. For example, the test controller 21 recognizes the memory instance while testing, and generates a memory selection signal for selecting the output thereof. In addition, the test controller 21 generates information for test completion when a test for one memory instance is completed, and outputs the generated information to an external device (not shown). When the test controller 21 receives information for test restart from an external device (not shown), the test controller 21 generates the memory selection signal to synchronize the completion and the restart between a plurality of tests, that is between a plurality of BIST circuits.

As shown in FIG. 7, the analyzing circuit 30 includes a memory output selector 31, a capture register 32, a bit comparator 34, a repair analyzer 35, an error detection unit 36, a repair analysis result register 37, a pass/fail flag register 38, and an output unit 39. The structures of the memory output selector 31, the capture register 32, the bit comparator 34, the repair analyzer 35, and the error detection unit 36 are the same as those in the first embodiment of the present invention.

As shown in FIG. 7, the repair analysis result register 37 is connected to the repair analyzer 35 and the output unit 39, and the pass/fail flag register 38 is connected to the error detection unit 36 and the output unit 39. The repair analysis result register 37 stores the repair analysis result output from the repair analyzer 35, and the pass/fail flag register 38 stores the error pass/fail flag output from the error detection unit 36. For example, as shown in FIG. 8, the repair analysis result register 37 includes a first repair analysis result register 37A and a second repair analysis result register 37B. The first repair analysis result register 37A is connected to the repair analyzer 35 and the second repair analysis result register 37B, and the second repair analysis result register 37B is connected to the first repair analysis result register 37A and the output unit 39. The repair analysis result stored in the first repair analysis result register 37A is transmitted to the second repair analysis result register 37B when a test for one memory instance is completed.

As shown in FIG. 7, the pass/fail flag register 38 includes a first pass/fail flag register 38A and a second pass/fail flag register 38B. The first pass/fail flag register 38A is connected to the error detection unit 36 and the second pass/fail flag register 38B, and the second pass/fail flag register 38B is connected to the first pass/fail flag register 38A and the output unit 39. The error pass/fail flag stored in the first pass/fail flag register 38A is transmitted to the second pass/fail flag register 38B when a test for one memory instance is completed.

As shown in FIG. 7, the output unit 39 is connected to the repair analysis result register 37, the pass/fail flag register 38, and an external device (not shown). When a test for one memory instance is completed, the output unit 39 outputs the repair analysis result stored in the repair analysis result register 37 and the error pass/fail flag stored in the pass/fail flag register 38 as parallel signals or serial signals to an external device (not shown) such as a memory tester. The repair analysis result and the error pass/fail flag are used by the external device (not shown) in the post process.

Figure 9:
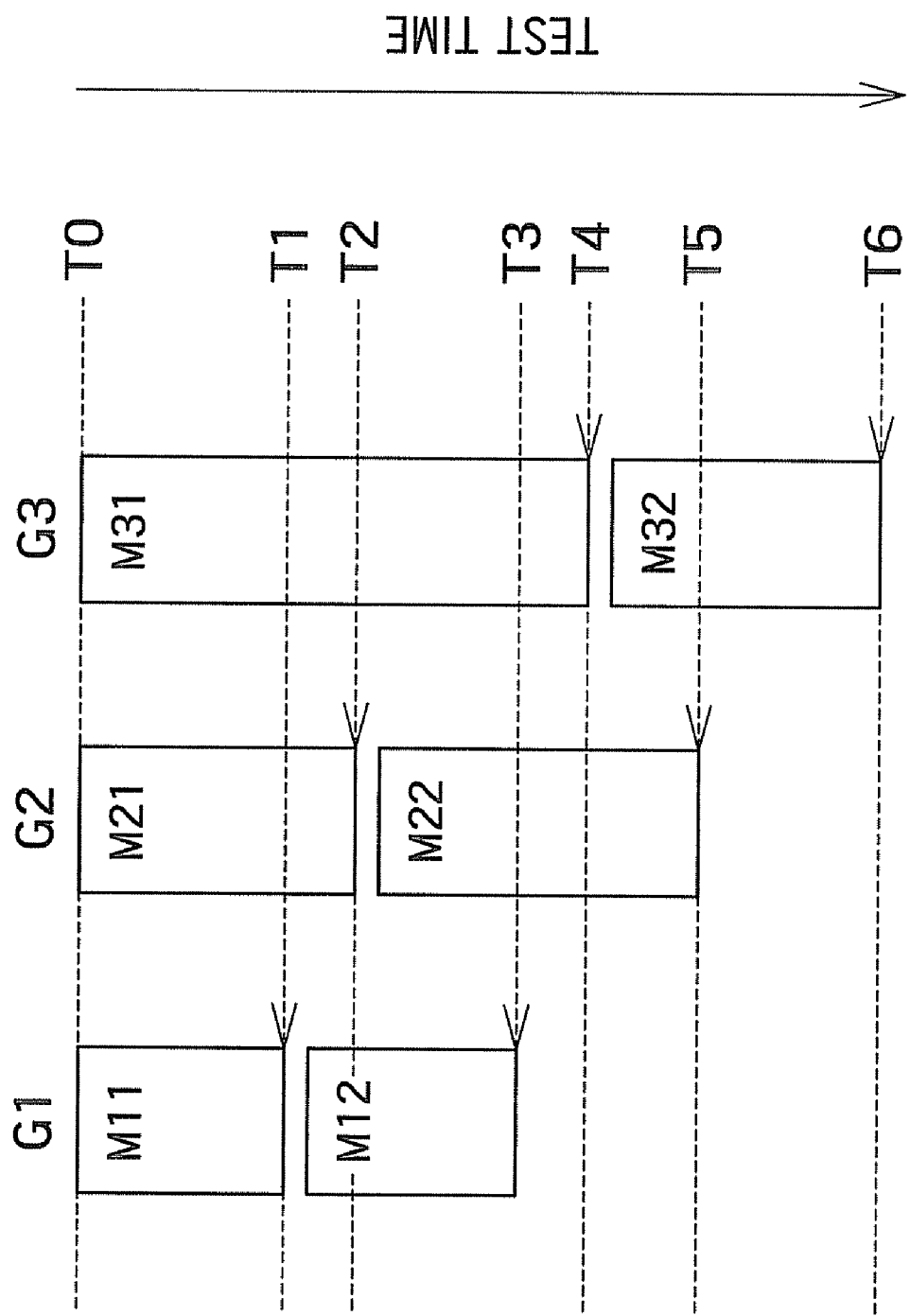
FIG. 9 is a timing chart illustrating a test process of the semiconductor integrated circuit according to the second embodiment of the present invention.

Next, a process of the semiconductor integrated circuit according to the second embodiment of the present invention will be described with reference to FIG. 9. FIG. 9 is a timing chart illustrating a test process of the semiconductor integrated circuit according to the second embodiment of the present invention.

In FIG. 9, G indicates a group including the semiconductor integrated circuit (the memory collar 10, the BIST circuit 20, and the analyzing circuit 30) shown in FIG. 7, and M indicates a memory instance to be tested. For example, memory instances M11 and M12 are tested in a group G1, memory instances M21 and M22 are tested in a group G2, and memory instances M31 and M32 are tested in a group G3. In FIG. 9, an arrow in the vertical direction indicates a test time T. That is, in each of the groups G1 to G3, the memory instances M are tested at different test times T.

First, at a time T0, in the groups G1 to G3, the memory instances M start to be tested at the same time.

At a time T1, in the group G1, a test for the memory instance M11 is completed, and information for test completion is output. Then, after the test result of the memory instance M11 is transmitted, a test for the memory instance M12 starts. The test result is transmitted as follows. The error pass/fail flag stored in the first pass/fail flag register 38A is transmitted to the second pass/fail flag register 38B, and the repair analysis result stored in the first repair analysis result register 37A is transmitted to the second repair analysis result register 37B. On the other hand, in the groups G2 and G3, the memory instances M21 and M31 are being tested.

At a time T2, in the group G2, a test for the memory instance M21 is completed, and information for test completion is output. After the test result of the memory instance M21 is transmitted, a test for the memory instance M22 starts. On the other hand, in the groups G1 and G3, the memory instances M12 and M31 are being tested.

At a time T3, in the group G1, a test for the memory instance M12 is completed. At that time, since the test result of the memory instance M11 is not output, the test result of the memory instance M12 is not transmitted. On the other hand, in the groups G2 and G3, the memory instances M22 and M31 are being tested.

At a time T4, in the group G3, a test for the memory instance M31 is completed, and information for test completion is output. After the test result of the memory instance M31 is transmitted, a test for the memory instance M32 starts. At that time, all the groups G1 to G3 output information for test completion. Therefore, the test results stored in the second pass/fail flag registers 38B and the second repair analysis result registers 37B in all the groups G1 to G3 are output to an external device (not shown). On the other hand, in the group G1, the test result of the memory instance M12 is transmitted, and the state of outputting information for test completion is maintained. As a result, all tests for the group G1 are completed. In the meantime, in the group G2, the memory instance 22 is being tested.

At a time T5, in the group G2, the test result of the memory instance M22 is transmitted, and the state of outputting information for test completion is maintained. As a result, a test for the group G2 is completed.

At a time T6, in the group G3, a test for the memory instance M32 is completed, and information for test completion is output. Then, the test result of the memory instance M32 is transmitted, and the output state of the information for test completion is maintained. As a result, a test for the group G3 is completed. At that time, the information for test completion of all the groups G1 to G3 is output. Therefore, the test results stored in the second pass/fail flag registers 38B and the second repair analysis result registers 37B in all the groups G1 to G3 are output to an external device (not shown).

According to the second embodiment of the present invention, as shown in FIG. 8, each of the repair analysis result register 37 and the pass/fail flag register 38 includes two registers. Therefore, it is possible to prevent an increase in the size of a semiconductor integrated circuit due to the addition of a test circuit comparing to the first embodiment of the present invention.

According to the second embodiment of the present invention, as shown in FIG. 9, the test controller 21 controls a test operation such that the test completion times of the BIST circuits 20 are synchronized with each other. Therefore, it is not necessary to install complicated software to an external device (not shown).

At least a portion of the semiconductor integrated circuit according to the above-described embodiments of the present invention may be composed of hardware or software. When at least a portion of the semiconductor integrated circuit is composed of software, a program for executing at least some functions of the semiconductor integrated circuit may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the semiconductor integrated circuit according to the above-described embodiment of the present invention may be distributed through a communication line (which includes wireless communication) such as the Internet. In addition, the program may be encoded, modulated, or compacted and then distributed by wired communication or wireless communication such as the Internet. Alternatively, the program may be stored in a recording medium, and the recording medium having the program stored therein may be distributed.

The above-described embodiments of the present invention are just illustrative, but the invention is not limited thereto. The technical scope of the invention is defined by the appended claims, and various changes and modifications of the invention can be made within the scope and meaning equivalent to the claims.

What is claimed is:

1. A semiconductor integrated circuit comprising:
   a plurality of memories configured to store data;
   a built-in self-test circuit configured to perform a test for the plurality of memories, the built-in self-test circuit comprising:
      a test controller configured to perform the test and generate a memory selection signal selecting a memory to be tested from the plurality of memories;
      an address generator configured to generate write and read addresses;
      a data generator configured to generate write data and an expected output value of the memory corresponding to the write data; and
      a control signal generator configured to generate a control signal performing a write operation for the write data to the write address of the memory and a read operation for read address of the memory; and
   an analyzer configured to analyze a test result of the built-in self-test circuit, the analyzer comprising:
      a memory output selector configured to select output data of the plurality of memories based on the memory selection signal generated by the test controller;
      a bit comparator configured to compare the output data selected by the memory output selector with the expected output value generated by the data generator bit by bit;
      an error detection unit configured to determine whether there is an error in the memory based on a comparison result of the bit comparator;
      a plurality of pass/fail flag registers corresponding to the plurality of memories and configured to store a pass/fail flag of the error detection unit;
      a repair analyzer configured to analyze a memory error based on the comparison result of the bit comparator and generate a repair analysis result;
      a plurality of repair analysis result registers corresponding to the plurality of memories and configured to store the repair analysis result generated by the repair analyzer; and
      an output unit configured to output the pass/fail flag stored in the plurality of pass/fail flag registers and the repair analysis result stored in the plurality of repair analysis result registers.

2. The circuit of claim 1, further comprising a capture register located between the error detection unit or the repair analyzer and the memory output selector, and configured to store the output data selected by the memory output selector.

3. The circuit of claim 2, wherein
   the plurality of memories comprises some memories having different bit widths from each other, and
   the bit comparator masks a bit of the expected output value in such a manner that the bit width of the output data selected by the memory output selector is a maximum bit width of the plurality of memories when the output data is not the maximum bit width.

4. The circuit of claim 1, wherein
   the plurality of memories comprises some memories having different bit widths from each other, and
   the bit comparator masks a bit of the expected output value in such a manner that the bit width of the output data selected by the memory output selector is a maximum bit width of the plurality of memories when the output data is not the maximum bit width.

5. The circuit of claim 1, wherein
   each pass/fail flag register stores the pass/fail flag for each memory instance, and
   each repair analysis result register stores the repair analysis result for each memory instance.

6. The circuit of claim 1, wherein the plurality of memories comprises a selector configured to select an input terminal for system or an input terminal for test.

7. A semiconductor integrated circuit comprising:
   a plurality of memories configured to store data;
   a built-in self-test circuit configured to perform a test for the plurality of memories, the built-in self-test circuit comprising:
      a test controller configured to perform the test in such a manner that one test is synchronized with the other test and generate a memory selection signal selecting a memory to be tested from the plurality of memories;
      an address generator configured to generate write and read addresses;
      a data generator configured to generate write data and an expected output value of the memory corresponding to the write data; and a control signal generator configured to generate a control signal performing a write operation for the write data to the write address of the memory and a read operation for read address of the memory; and an analyzer configured to analyze a test result of the built-in self-test circuit, the analyzer comprising:

a memory output selector configured to select output data of the plurality of memories based on the memory selection signal generated by the test controller;

a bit comparator configured to compare the output data selected by the memory output selector with the expected output value generated by the data generator bit by bit;

an error detection unit configured to determine whether there is an error in the memory based on a comparison result of the bit comparator;

a pass/fail flag register configured to store a pass/fail flag of the error detection unit;

a repair analyzer configured to analyze a memory error based on the comparison result of the bit comparator and generate a repair analysis result;

a repair analysis result register configured to store the repair analysis result generated by the repair analyzer; and an output unit configured to output the pass/fail flag stored in the pass/fail flag register and the repair analysis result stored in the repair analysis result register.

8. The circuit of claim 7, wherein the pass/fail flag register comprises a first and second pass/fail flag registers configured to store the pass/fail flag, the repair analysis result register comprises a first and second repair analysis result registers configured to store the repair analysis result, when the test for one memory instance is completed, in the pass/fail flag register, the pass/fail flag stored in the first pass/fail flag register is transferred to the second pass/fail flag register, and in the repair analysis result register, the repair analysis result stored in the first repair analysis result register is transferred to the second repair analysis result register, the test controller generates information for test completion, and the output unit outputs the pass/fail flag stored in the second pass/fail flag register and the repair analysis result stored in the second repair analysis result register after the information for test completion is generated by the test controller.

9. The circuit of claim 8, further comprising a capture register located between the error detection unit or the repair analyzer and the memory output selector, and configured to store the output data selected by the memory output selector.

10. The circuit of claim 9, wherein the plurality of memories comprises some memories having different bit widths from each other, and the bit comparator masks a bit of the expected output value in such a manner that the bit width of the output data selected by the memory output selector is a maximum bit width of the plurality of memories when the output data is not the maximum bit width.

11. The circuit of claim 7, further comprising a capture register located between the error detection unit or the repair analyzer and the memory output selector, and configured to store the output data selected by the memory output selector.

12. The circuit of claim 11, wherein the plurality of memories comprises some memories having different bit widths from each other, and the bit comparator masks a bit of the expected output value in such a manner that the bit width of the output data selected by the memory output selector is a maximum bit width of the plurality of memories when the output data is not the maximum bit width.

13. The circuit of claim 7, wherein the plurality of memories comprises some memories having different bit widths from each other, and the bit comparator masks a bit of the expected output value in such a manner that the bit width of the output data selected by the memory output selector is a maximum bit width of the plurality of memories when the output data is not the maximum bit width.

14. The circuit of claim 7, wherein each pass/fail flag register stores the pass/fail flag for each memory instance, and each repair analysis result register stores the repair analysis result for each memory instance.

15. The circuit of claim 7, wherein the plurality of memories comprises a selector configured to select an input terminal for system or an input terminal for test.

* * * * *